United States Patent [19]

Kantz

[11] Patent Number: 5,051,611

[45] Date of Patent: Sep. 24, 1991

[54] POWER-UP CIRCUIT WITH HYSTERESIS FOR AN OUTPUT BUFFER

[75] Inventor: Anthony Kantz, Portland, Me.

[73] Assignee: Quadic Systems, Inc., Gorham, Me.

[21] Appl. No.: 454,064

[22] Filed: Dec. 20, 1989

[51] Int. Cl.$^5$ .................... H03K 5/153; H03K 3/284
[52] U.S. Cl. .................... 307/272.3; 307/360; 307/592; 307/296.4; 307/475
[58] Field of Search ................ 307/272.3, 592, 296.4, 307/360, 475, 473, 359

[56] References Cited

U.S. PATENT DOCUMENTS

| | | | |
|---|---|---|---|
| 4,254,347 | 3/1981 | Ray | 307/592 |
| 4,311,927 | 1/1982 | Ferris | 307/473 |
| 4,409,501 | 10/1983 | Eickerman et al. | 307/272.3 |
| 4,481,430 | 11/1984 | Houk et al. | 307/296.4 |
| 4,581,550 | 4/1986 | Ferris et al. | 307/456 |
| 4,661,727 | 4/1987 | Ferris et al. | 307/456 |
| 4,697,103 | 9/1987 | Ferris et al. | 307/456 |
| 4,717,840 | 1/1988 | Ouyang et al. | 307/592 |
| 4,948,995 | 8/1990 | Takahashi | 307/443 |

Primary Examiner—Stanley D. Miller
Assistant Examiner—Richard Roseen
Attorney, Agent, or Firm—Thomas L. Bohan

[57] ABSTRACT

An improved power-up circuit for exerting control over output buffer devices in such a way as to disable these buffer devices during the period when the extended circuit is vulnerable to transient effects as the common power supply voltage $V_{cc}$ is rising during the "power-up" or "power-down" of the extended circuit. One particular such transient effect is the loading down of the power supply due to the buffer devices being in the current-sourcing and in the current-sinking states simultaneously. One improvement over the earlier circuitry is the provision of an asymmetry in the values of $V_{cc}$ at which control is transferred between the power-up circuit and the rest of the circuit as $V_{cc}$ is rising during power-up and as $V_{cc}$ is falling during power-down, respectively. In particular, the design of the present circuit allows control to be exerted over the buffer devices up to a relatively high value of $V_{cc}$ during power-up without exposing the extended circuit to the risk of being inadvertantly disabled upon the occurrence of noise-induced dip in $V_{cc}$ after the power supply voltage is up to its operating range. The asymmetry or hysteresis allows the cut-in voltage of the present circuit (during power-down) to be set at a lower value than the cut-out voltage (during power-up). The hysteresis is established by use of a second transistor in the power-up circuit which switches off at the same time that the threshold transistor switches on. A second improvement offered by the present circuit is the speed with which the cutting in and cutting out occurs. This speed is effected by the positive feedback means by which the second transistor is coupled with the switching transistor. As a consequence, the speed of switching is made independent of the edge rate of $V_{cc}$.

11 Claims, 6 Drawing Sheets

POWER-UP CIRCUIT WITH HYSTERESIS FOR AN OUTPUT BUFFER

BACKGROUND OF THE INVENTION

1. Field of the Invention

This invention relates generally to the field of "turn-on circuits" used for effecting smooth time sequencing for the activation and deactivation of multiple subcircuits within an extended circuit complex. More particularly, it relates to mediating the communication between a plurality of output gates and the common conductor or bus to which said output gates are connected. More particularly yet, it relates to the field of circuits used to automatically maintain output buffer devices—which connect output gates to a common bus—in their high impedance "third state" during the periods that the common power supply voltage $V_{cc}$ is being powered up or powered down. The invention provides an improvement in the speed with which a power-up circuit exchanges control with the rest of the extended circuit once $V_{cc}$ reaches specified threshold levels. Another improvement is the greater immunity from noise-induced dips in $V_{cc}$ which the invention provides a power-up circuit while the extended circuit is otherwise operating properly.

2. Description of Prior Art

As background for the subsequent discussion, it is noted that the use of a tristate output buffer device ("buffer") or its equivalent is essential when connecting a TTL Transistor-Transistor Logic (TTL) output gate ("chip") to a common conductor ("bus") which is to serve as the output means for a plurality of such chips. The individual buffers and their associated circuitry are intended to ensure that only a single chip at a time is communicating with the bus and that for all practical purposes the bus cannot sense the presence of any of the other buffers and hence of their associated chips at that time. One says that only a single buffer at a time is enabled. When the buffer is enabled, it is in its active mode and can serve as a current source or a current sink to the bus, depending on what input signal it receives from its associated chip; one says that in its active mode the buffer is either "current sourcing" or "current sinking." When the buffer is in its third state, it is disabled and simply presents a high (resistive) impedance to the bus. In the properly operating multi-chip logic circuit, all of the buffers save one are disabled at any instant. Typically, a separate buffer input terminal—in addition to the buffer input terminal controlled by the buffer's associated chip—is used to switch the buffer between the active and inactive modes. This separate terminal is the Output Enable (OE) terminal; the signal to the OE terminal is supplied by the output of a separate TTL sub-circuit, the Output Enable Gate (OEG). The input to the OEG is designated "nOE." FIG. 1 shows the interconnections of the sub-circuits just described: the chip, the buffer, the OEG, and the bus. The circuit of FIG. 1 represents a single unit within a multi-chip extended circuit. Parts of the circuit not depicted in FIG. 1 are responsible for ensuring that the nOE for each OEG unit has the proper voltage value to cause the OEG to disable the buffer associated with it (unless it happens to be the sole buffer which is to be enabled). As stated above, the properly functioning extended circuit will have all but one of the buffers disabled at any one time; the remaining buffer will be enabled and—depending on its input from the chip—will constitute a current sink or a current source with respect to the bus. The OEG, like all TTL logic gates—including those present in the extended circuit under discussion here—is controlled by an input voltage which has two useful levels: a high level (binary logic one) and a low level (binary logic zero.) Similarly, the output of the OEG—and of all TTL gates—is either binary logic one (high voltage) or binary logic zero (low voltage). (Within this context, any voltage between ground and $V_{IL}$ is low level (binary zero) and any voltage between $V_{IH}$ and $V_{cc}$ is high level (binary one). Note that $V_{IH}$ is greater than $V_{IL}$.) The OEG is an invertor in the sense that a binary zero input results in a binary one output and vice versa. The buffer, being a three-state device, is more complicated. For present purposes, it is only necessary to know that when the OEG output is low (binary zero) the buffer will be placed in its high impedance state—the disabled state desired during power-up and power-down.

With continuing reference to FIG. 1, note that any voltage between ground and $V_{IL}$ is placed on the buffer input terminal of an enabled buffer, buffer's current-sourcing circuitry will be on and its current-sinking circuitry will be off; on the other hand, if any voltage between $V_{IH}$ and $V_{cc}$ (the common power supply voltage) is placed on that buffer input terminal, that buffer's current-sourcing circuitry will be off and its current-sinking circuitry will be on. That is, when the enabled buffer has a voltage between 0 and $V_{IL}$ applied to its input terminal it will be in its current-sourcing state and when it has a voltage between $V_{IH}$ and $V_{cc}$ applied to its input terminal it will be in its current-sinking state. On the other hand, if a low-level voltage is applied to the OEG i.e., if nOE is a low level voltage, the current-sourcing circuitry and current-sinking of the associated buffer circuitry are both disabled and the buffer presents a high impedance to the bus. A high-level voltage at nOE will cause the OEG to enable the buffer, which then can respond to the signal applied to the buffer input terminal so as to appear to the bus as either a current source or as a current sink.

For the buffer input voltage range $V_{IL}$ to $V_{IH}$ the state of the enabled buffer is ambiguous: potentially, it can have both the current-sourcing and the current-sinking circuitry activated simultaneously, a situation which can load down both the bus and the common power supply. Fortunately, during normal operation, the transition between current-sourcing and current-sinking states is sufficiently rapid that this bi-phasic mode does not constitute a problem. In contrast, during power-up and to a lesser extent during power-down of the power supply the buffer input voltage can tarry in the ambiguous region for a sufficiently long period to cause loading problems and in particular to draw an excessive current spike from the common power supply. For that matter, during power-up the possibility exists that the various subcircuits, in particular the buffer subcircuits, will be energized before the OEG is capable of disabling the buffers. This means that during power-up all of the buffers may appear to the bus to be current-sourcing, current-sinking, or some combination of the two modes. Depending on the particular circuit, this may be very bad for system reliability; in most if not all TTL circuits of the type under discussion this is bad in terms of the load it places on the power supply. In general the $V_{cc}$ level during power-up will increases much less rapidly than the rising or falling voltages on the inputs to the various TTL circuits within the extended circuit. A slow rise-time for $V_{cc}$ generally results in slow rise- (or fall-) times for the voltages on nodes internal to the circuit. The combination of these two facts can cause large power supply current surges during power-up. The buffers usually have the highest amount of current sourcing and sinking capability in the type of circuit under discussion. Because of this they are likely to have the greatest power-up surges. It is for this reason that it is particularly desirable to hold the individual OEGs in the state which places the buffers in their high impedance state throughout the vulnerable part of the power-up (or power-down) transition.

Various attempts have been made to address this problem, generally by connecting yet another auxiliary sub-circuit to the array set out in FIG. 1. This is depicted schematically in FIG. 1a, where a power-up circuit is shown as an additional control for the OEG, supplementing the nOE input. The purpose of the power-up circuit/OEG combination is to hold the buffer disabled while $V_{cc}$ is passing through the transient-sensitive range during power-up and power-down (and "power-out"). Although the power-up circuit can be energized by a separate power supply, it is generally integrated with the other sub-circuits and energized by the same common power supply voltage $V_{cc}$ used by the rest of the extended multi-chip circuit. The power-up circuit must ensure that the OEG output is low during the critical values of $V_{cc}$. (During normal operation the enabling/disabling signal to the OEG is produced at the OEG input nOE. During power-up and power-down, the power-up circuit in effect seizes control; it overrides the nOE.)

The conventional power-up circuit most commonly used at present is based on Houk et al. (U.S. Pat. No. 4,481,430). FIG. 2 illustrates such a circuit in isolation from the OEG to which its output $V_{OUT}$ is to be directed. It operates in the following manner as a function of $V_{cc}$. (All transistors in this discussion are conventional bipolar junction transistors with collector, base, and emitter electrodes. Such a transistor will be described as "conducting" when current is flowing between the collector and emitter electrodes; the transistor turns on, i.e., becomes conducting, when the voltage between the base and emitter reaches a certain level, as discussed below. Since all relevant circuits will have a direct ground connection, all voltage levels identified throughout the following discussions will be implicitly referenced to ground potential.) As $V_{cc}$ ramps during power-up from zero toward its specified operating range, the voltage $V_{OUT}$ at first tracks and is equal to $V_{cc}$ (assuming no current is drawn at $V_{OUT}$). This is because for $V_{cc}$ below a certain threshold level Q14 is not conducting and hence there is no current through R16.

As $V_{cc}$ increases with Q14 non-conducting, there comes a point at which $V_{OUT}$ will become sufficiently high to exert control over the OEG (to which it is directed) so as to disable the buffer. Although the value of $V_{cc}$ at which this power-up circuit first exerts control over the OEG can only be determined from a consideration of its connection with the OEG—as will be done below—the value of $V_{cc}$ at which the power-up circuit cuts out can be easily calculated in terms of the circuit elements as illustrated in FIG. 2. For reasons to be shown below, the cut-out occurs when Q14 turns on, at which point $V_{OUT}$ suddenly falls because of the ensuing voltage drop across R16. Q14 turns on when its base-emitter junction becomes sufficiently forward-biased that it passes current. Since the Q14 emitter is grounded, this critical condition can be stated in terms of the Q14 base voltage, $V_{14B}$. The typical base-emitter voltage at which a silicon bipolar junction transistor becomes conducting at room temperature is 0.8 volts, with the exact value depending on the transistor's particular physical characteristics. Since all transistors having a particular design can be taken to have the same critical base-emitter voltage and since the transistors in the circuits to be discussed here will all be taken to be transistors of the same design, one can use the same base-emitter turn-on voltage—$V_{BE}$—for all of the transistors to be discussed. (For all practical purposes, $V_{BE}$ is not just the base-emitter voltage at which the junction begins to conduct; it remains the base-emitter voltage regardless of the current through the forward-biased junction. $V_{BE}$ does vary with temperature; nominally 0.8 volts, it can be as high as one volt at low temperatures.)

Thus, Q14 begins conducting when $V_{14B}$ becomes equal to $V_{BE}$, a condition which clamps the voltage across R15 to $V_{BE}$ and hence limits the current through R15 to $V_{BE}/R_{15}$. (Of course, as $V_{cc}$ continues to increase above its Q14 turn-on value, the current through R13 continues to increase, the augmentation being diverted as base current through Q14.) In order to calculate the value of $V_{cc}$ at which Q14 turns on, then, it is only necessary to determine the minimum level of $V_{cc}$ necessary to produce a current $I_{15}=V_{BE}/R_{15}$ through R15, given no other drains for current in that branch of the circuit. Note that when this occurs the voltage drop across each of the transistors Q12 and Q13 will be $V_{BE}$, since—as long as current is flowing in that branch of the circuit—they will be behaving simply as two forward-biased base-emitter junctions in series. (For values of $V_{cc}$ less than 2 $V_{BE}$ these two series transistors will in effect be blocking and no current will flow through R13 and R15.) Thus, the minimum value of $V_{cc}$ for which Q14 will conduct, $V_{cc(1)}$, is given by the following equation summarizing the voltage drops along the circuit branch containing R13 and R15 when current is flowing in that branch. Generally, $$V_{cc}=I(R_{13}+R_{15})+2V_{BE} \tag{1a}$$

At the instant that the voltage drops across $R_{15}$ reaches $V_{BE}$, $$V_{cc}=V_{cc(1)}=(V_{BE}/R_{15})(R_{13}+R_{15})+2V_{BE} \tag{1b}$$

I.e., $$V_{cc(1)}=V_{BE}[3+(R_{13}/R_{15})] \tag{2}$$

This is based on the condition that the Q14 base current is null at $V_{cc}=V_{cc(1)}$. For $V_{cc}>V_{cc(1)}$, the following more general relationship holds.

$$V_{cc}=V_{BE}[3+R_{13}/R_{15}]+R_{13}I_{14B}, \tag{3}$$

where $I_{14B}$ is the base current through Q14, the total IR drop across R13 being $(I_{14B}+V_{BE}/R_{15})R_{13}$.

Summarizing, Q14 becomes conducting when $V_{14B}$ reaches a level $V_{BE}$. This results in $V_{OUT}$ falling drastically and corresponds to the point where the conventional power-up circuit yields control, the point where it "cuts out," returning OEG control to the nOE input. The behavior of $V_{OUT}$ as a function of $V_{cc}$ for the power-up circuit shown in FIG. 2 is illustrated by the graph in FIG. 2a, where $V_{OUT}$ is shown to follow $V_{cc}$ until $V_{cc}$ reaches the point A, at which $V_{OUT}$ begins to fall back toward the abscissa, leveling off at a value $V_{SAT}$ when $V_{OUT}$ reaches point B.

Referring to EQ(2), it can be seen that if R13 is chosen to have half the value of R15, then Q14 will turn on when $V_{cc}$ reaches a voltage of 3.5 $V_{BE}$. Of course, the turn-on of Q14 and hence the cut-out of the power-up circuit will not be instantaneous and this can be a problem, especially if nOE is set at binary zero level (which can lead to the buffer being put into an ambiguous state during the "cutting out," with a resultant loading down of the power supply at that point, the very condition which was to be avoided).

FIG. 3 depicts the power-up circuit of FIG. 2 tied into a typical OEG, where the OEG is that part of the circuit to the right of the dashed vertical line. In the depiction, $V_{OUT}$ is connected to the base of transistor Q15 of the OEG. In turn, OE the output of the OEG therefor drives the buffer device which is coupled to the common bus of the extended multi-chip circuit. Recall that when the OEG output is low—i.e., in the binary logic zero state—the buffer is disabled. Q15 starts to conduct once its base-emitter voltage reaches $V_{BE}$, that is, once $V_{OUT}$ reaches $V_{BE}+V_{SH}$, where $V_{SH}$ is the voltage drop across the forward-biased Schottky diode D16. More importantly, once $V_{OUT}$ reaches 2 $V_{BE}$, Q19—the base of which is tied to the emitter of Q15—also starts to conduct; that is, both Q15 and Q19 are turned on. (Note also that because $V_{OUT}$, that is, $V_{15B}$, the base voltage of Q15, is connected to ground through the two forward-biased base-emitter junctions in series, it can never exceed 2 $V_{BE}$.) When Q19 turns on, OE falls to a binary zero level and the buffer will be placed in its high-impedance state. Note further that, because the transistor Q16 is connected in exactly the same way as Q15 with respect to Q19, one can also obtain a low-level OE and hence put the buffer in its high-impedance state by setting the Q16 base voltage to 2 $V_{BE}$; this is effected by setting nOE to logic one. Restated, the buffer is disabled if either of the following two conditions is satisfied: 1) $V_{OUT}$ equals 2 $V_{BE}$; 2) nOE is set at logic one. When the first condition is met, one says that the power-up circuit seized control from nOE. TTL outputs typically start conducting when the common power supply voltage reaches 2 $V_{BE}$. In the absence of some kind of power-up circuit it is not possible to input an nOE equal to the requisite 2 $V_{BE}$ until the rising $V_{cc}$ reaches a value slightly larger than 3 $V_{BE}$. This means that in the absence of auxiliary power-up circuitry, all of the gates could be conducting as $V_{cc}$ passed between 2 $V_{BE}$ and 3 $V_{BE}$ on the way up to its specified operating range. Ultimately, of course, it is necessary that control over the OEG be passed back to the nOE input and hence to the extended circuit. That passing back of the control is what happens when Q14 switches on, as described above. In summary, the power-up circuit of FIG. 2 and FIG. 3 takes control of the OEG when the rising $V_{cc}$ reaches a level 2 $V_{BE}$; it passes control back to the nOE when the rising $V_{cc}$ reaches a level 3.5 $V_{BE}$ (given the choice of the ratio $R_{13}/R_{15}$ set out above). The graph in FIG. 3a illustrates the key transition points. Note that it differs from the graph of FIG. 2a only in showing the clamping of $V_{OUT}$ at 2 $V_{BE}$, and illustrating the consequential elimination of the rounded part of the FIG. 2a curve.

The power-up circuit shown in FIG. 2 and FIG. 3 is identical to the "threshold activation circuit" of Houk et al. but for the expedient of replacing diodes D1 and D2 of Houk et al. by diode-connected transistors Q12 and Q13. One advantage of the modification is that the i-v characteristics of the forward-biased base-emitter junctions of the transistors used in place of the diodes will be the same as those of the switching transistor Q14. (This fact leads to a much cleaner set of equations, since the voltage drop across all of the forward-biased junctions can now be specified as $V_{BE}$.)

Note that the traditional power-up circuit acts the same way during power-down of the common power supply voltage, $V_{cc}$, as it does during power-up. When the falling $V_{cc}$ reaches a level of 3.5 $V_{BE}$, Q14 switches off (given the circuit elements selected above), $V_{OUT}$ jumps back to 2 $V_{BE}$ and the buffer is disabled. Thus, during the power-down as well as during power-up, the power-up circuit ensures that the buffer will be disabled for $V_{cc}$ voltages in the range 2 $V_{BE}$ to 3.5 $V_{BE}$.

One of the factors which has to be taken into consideration in selecting the cut-out value of $V_{cc}$ is that it cannot be so high as to expose the circuit to being disabled every time $V_{cc}$ drops momentarily because of noise-induced fluctuations during normal operations. On the other hand, setting the cut-out value too low can leave the extended circuit vulnerable to power-up transients. This need to compromise is a real problem with the current power-up circuit under some circumstances. From the noise-induced fluctuations in $V_{cc}$ expected and from the specified operating level for $V_{cc}$, one can conclude that the highest value one can select for the cut-out/cut-in voltage $V_{cc(1)}$ in the conventional circuit is 3.5 volts, which at low temperatures is equal to 3.5 $V_{BE}$. To select it for a higher level would be to risk inadvertant cutting in of the power-up circuit during normal operation. On the other hand, the extended circuit is not always past its vulnerable region during power up by the time $V_{cc}$ reaches 3.5 $V_{BE}$. Given those constraints, it would be desirable to have a cut-out voltage which was higher than the cut-in voltage (which would be set at 3.5 $V_{BE}$).

Also a problem with the conventional power-up circuit is the relative slowness with which it cuts out, a slowness which can lead to the power supply drawing a spike of current in excess of its rated level at the time the power-up circuit is cutting out (or cutting in during power-down).

What is needed, therefore, is a power-up circuit having a high cut-out voltage, a low cut-in voltage, and a much faster switching rate than has been available previously.

SUMMARY OF THE INVENTION

The present invention comprises a simple power-up circuit designed to be integrated into a larger output enable gate circuit and to exert control over that circuit's output during the times that $V_{cc}$ is rising or falling during power-up and power-down, respectively, in a way which provides at least two distinct improvements over prior art power-up circuits. In particular, and in contrast to the prior art, the invention circuit will not exert control during the temporary decreases in $V_{cc}$ associated with noise even if these noise-related decreases lower $V_{cc}$ to a voltage below that at which the invention circuit yielded control during power-up. Indeed, it is one of the goals of the present invention to provide the option of depressing as far as possible the $V_{cc}$ level at which the circuit cuts in during power-down while at the same time maintaining as high as feasible the $V_{cc}$ level at which the circuit cuts out during power-up. By introducing a hysteresis means, these two levels can be set quasi-independently. The hysteresis means is basically a threshold transistor which is connected between the power supply and ground in such a way that once it switches on—at a certain threshold level of $V_{cc}$, $V_{ccU}$—thereby causing the power-up circuit to relinquish control, it remains on even as $V_{cc}$ falls significantly below that level. Since the state of this threshold transistor is what determines whether or not the invention circuit exerts control over the output enable gate, this behavior is seen to provide the hysteresis necessary to achieve one goal of the invention. The other distinct improvement over the prior art is achieved by incorporating a feedback transistor means so that once the minimum voltage is reached at which the threshold transistor switches on, that switching occurs extremely rapidly. (In fact, the switching times are lowered into the nanosecond range characteristic of general switching in TTL gates. This contrasts with the conventional power-up circuitry, in which the switching is tied to—and only slightly faster than—the $V_{cc}$ rise-time which is on the order of milliseconds.) The simplicity of the invention circuit, incorporating as it does only two transistors, four resistors, and one effective diode, allows the user to easily adjust the cut-in and cut-off values for $V_{cc}$.

PREFERRED EMBODIMENT OF THE INVENTION

Figure 1:
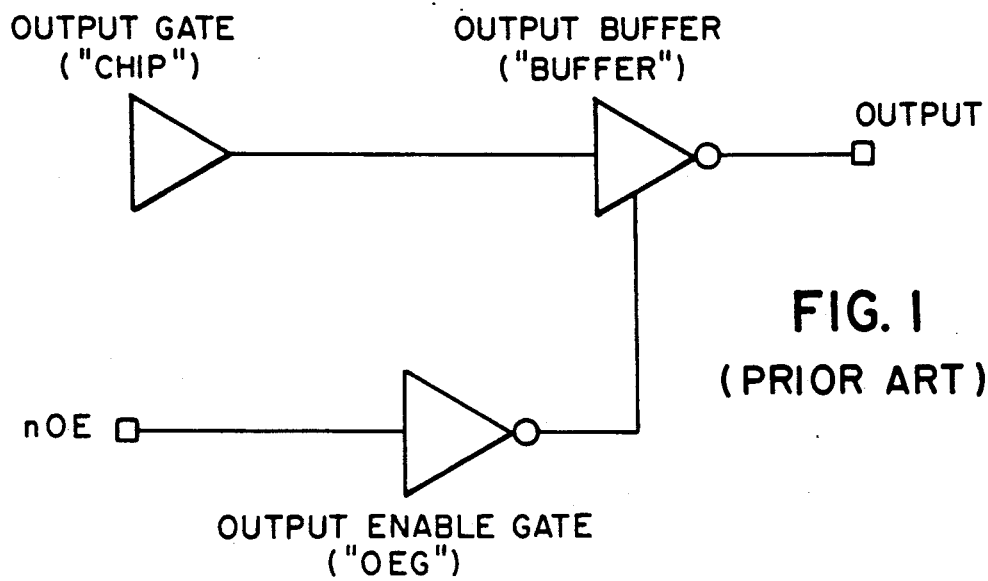
FIG. 1 is a schematic diagram of the interconnections of a TTL output gate ("chip"), a TTL output buffer device ("buffer"), a TTL output enable gate ("OEG"), and a common bus.
Figure 1A:
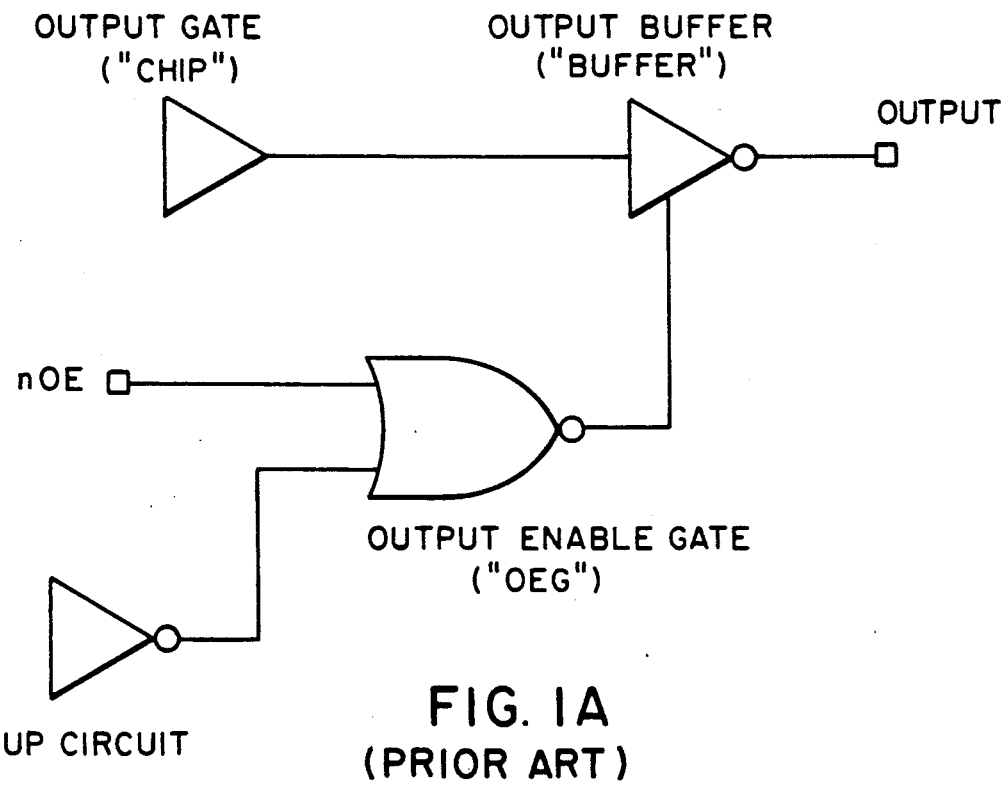
FIG. 1a shows the diagram of FIG. 1 with a power-up device added in the manner to which the present invention is intended to be used.
Figure 2:
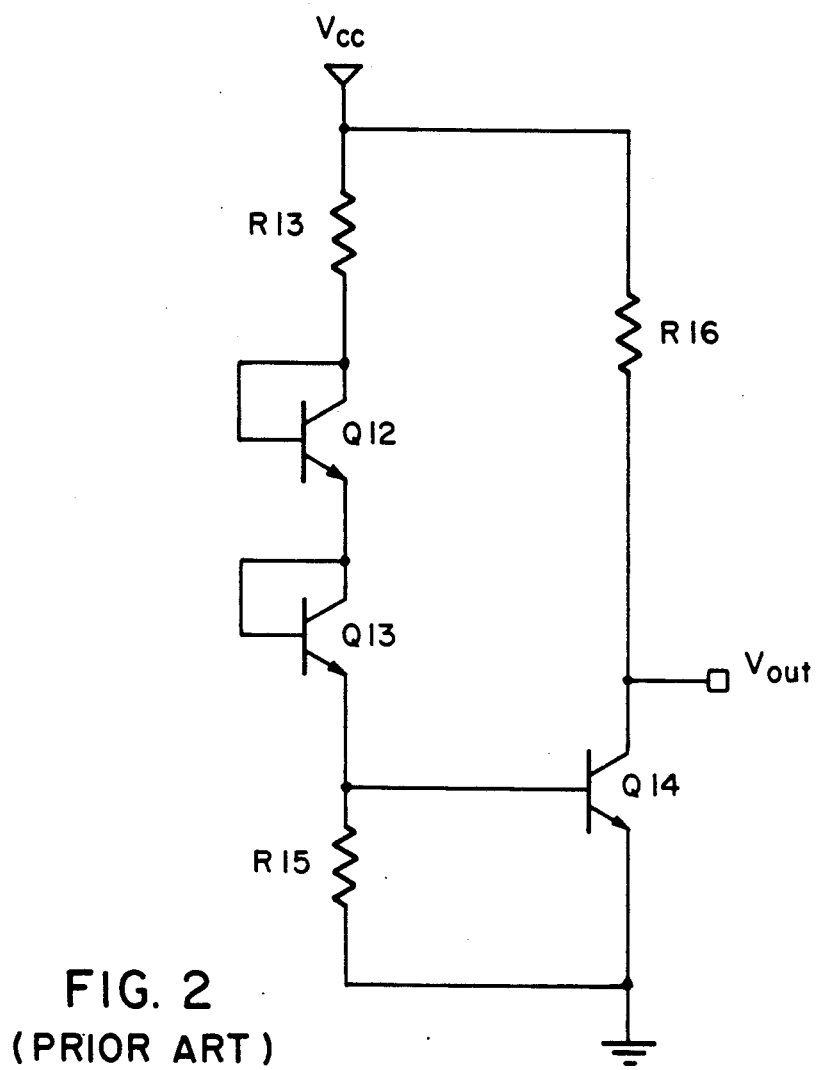
FIG. 2 is a circuit diagram of a typical prior art power-up circuit shown in isolation.
Figure 2A:
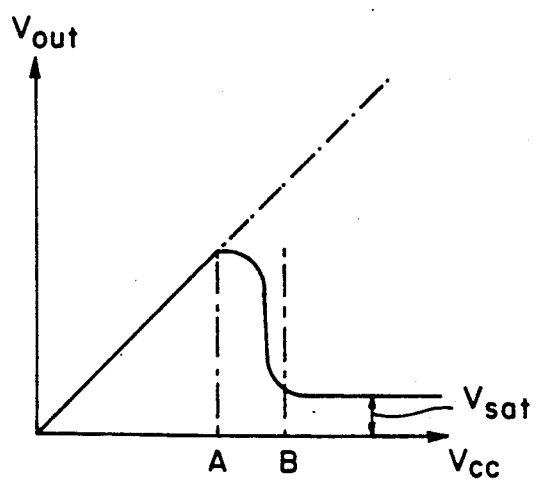
FIG. 2a is a graph of the output voltage of the isolated prior art circuit illustrated in FIG. 2 as a function of power supply voltage $V_{cc}$.
Figure 3:
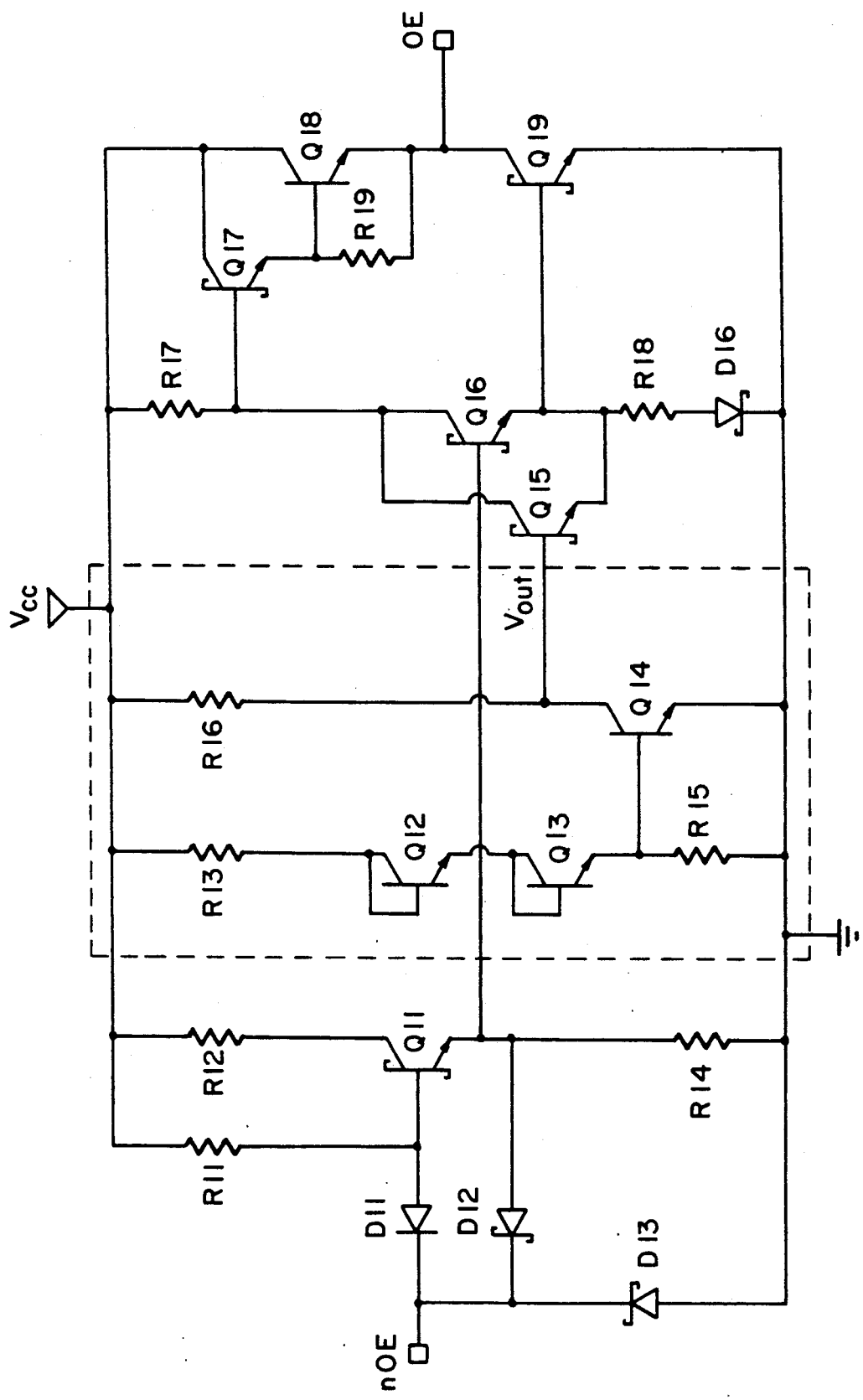
FIG. 3 is a circuit diagram of the prior art circuit illustrated in FIG. 2 as it is typically incorporated into output enable gate (OEG) circuitry.
Figure 3A:
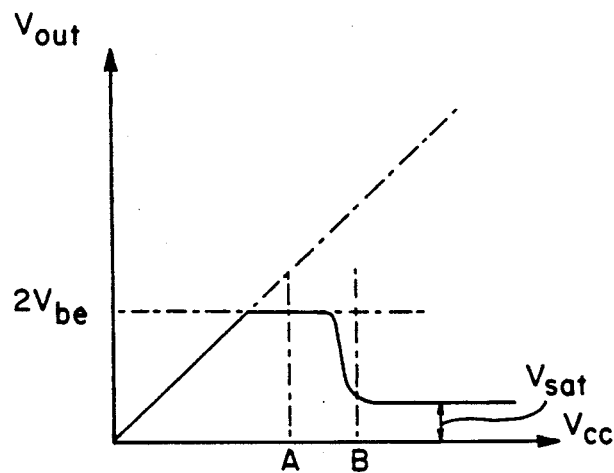
FIG. 3a is a graph of the output voltage of the circuit illustrated in FIG. 2 when the output of said circuit is connected into the OEG circuitry illustrated in FIG. 3.
Figure 4:
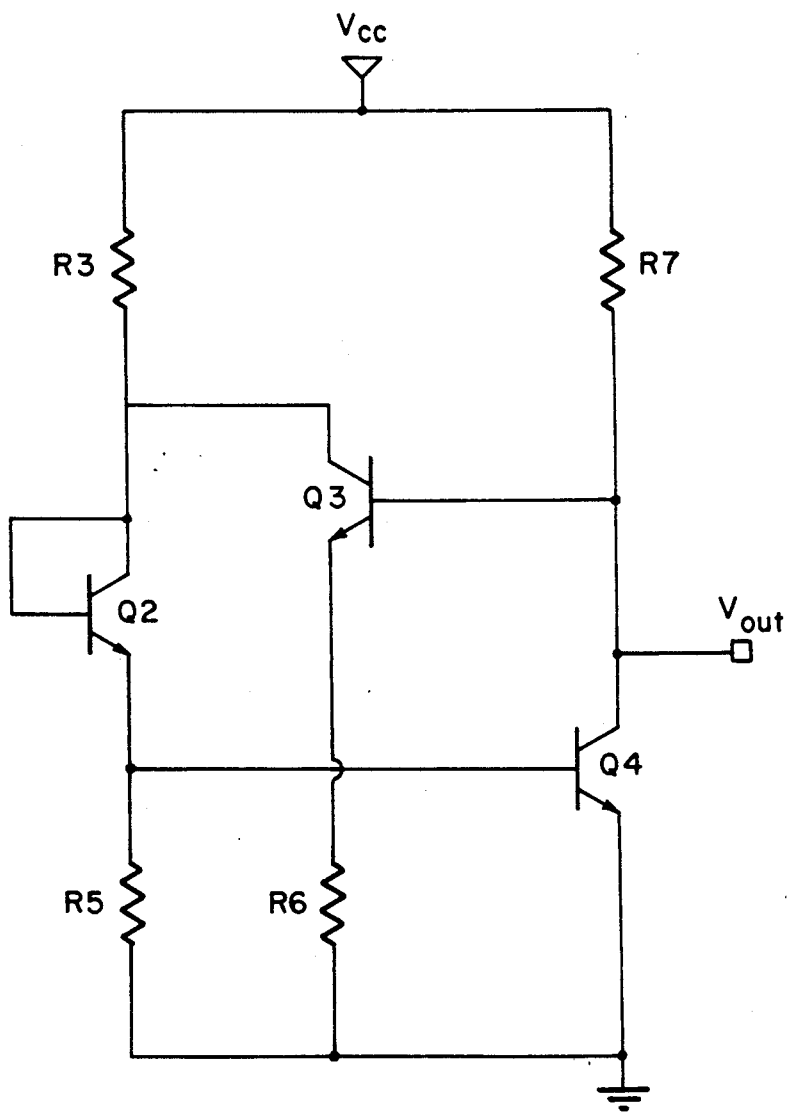
FIG. 4 is a circuit diagram of the isolated power-up circuit according to the present invention.
Figure 5:
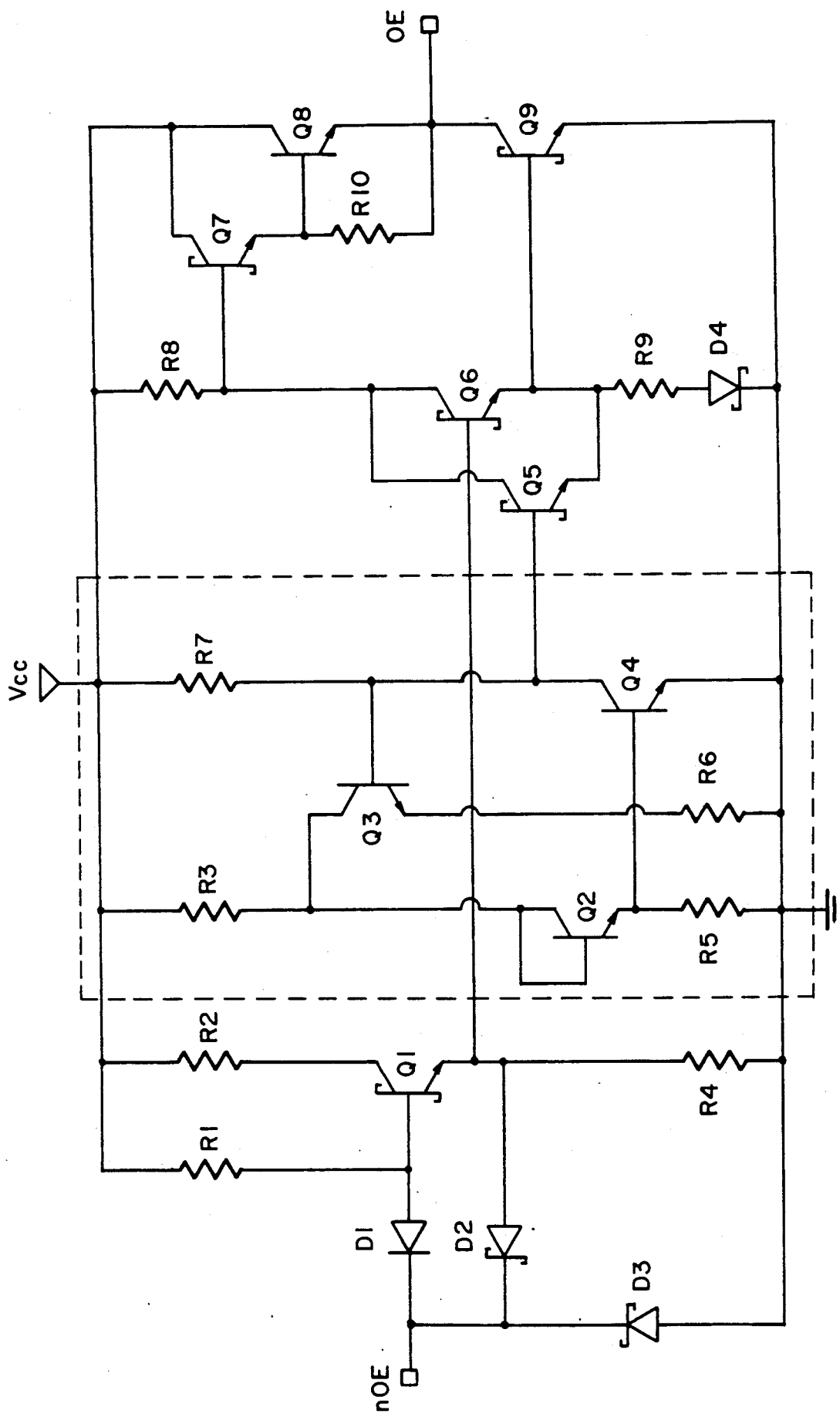
FIG. 5 is a circuit diagram showing the present invention incorporated into typical OEG circuitry.
Figure 5A:
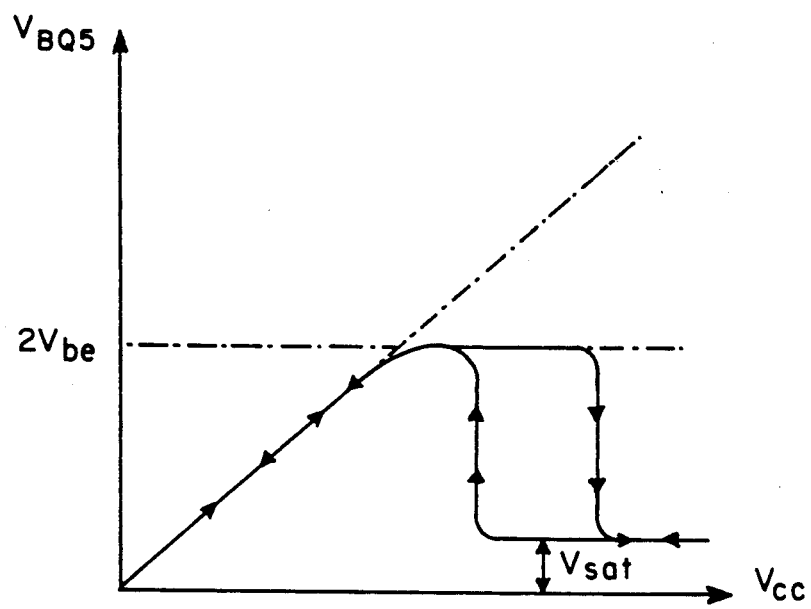
FIG. 5a is a graph of the invention circuit's output voltage as a function of power supply voltage $V_{cc}$ when that circuit's output is connected as shown in FIG. 5.

FIG. 4 illustrates a particular representation of the power-up circuit which is the subject matter of the instant invention. FIG. 5 depicts the same circuit integrated with OEG circuitry. Said power-up circuit comprises the resistors R3, R5, R6, and R7 as well as the transistors Q2, Q3, and Q4. The output of said power-up circuit—$V_{OUT}$—is taken from the collector of Q4; i.e., $V_{OUT}$ the Q4 collector voltage $V_{4C}$. Since, as shown in FIG. 5, $V_{4C}$ is connected to ground through two forward-biased base-emitter junctions in series—those of the OEG transistors Q5 and Q9—it can never exceed a voltage $2V_{BE}$; thus $V_{4C}$ is always in the range zero to $2V_{BE}$. Just as with the prior art discussed above, the buffer is disabled as long as $V_{4C}$ is equal to $2V_{BE}$. When Q4 is on, $V_{OUT}$ falls below $2V_{BE}$ and the power-up circuit cuts out; it cedes control of the OEG to the nOE terminal. Since it is a reasonable assumption that transistor base currents are negligible, it is clear that with Q4 not on, $V_{4C} = V_{cc}$ until $V_{cc}$ reaches $2V_{BE}$ and that $V_{OUT}$ is then clamped at that level until Q4 switches on. Thus, during power-up the range of $V_{cc}$ for which the power-up circuit of the present invention exerts control is from $V_{cc} = 2V_{BE}$ up to the value of $V_{cc}$ at which Q4 switches on: $V_{ccU}$. Conversely, during power-down, the range of $V_{cc}$ for which the power-up circuit of the present invention exerts control is from that value of $V_{cc}$ at which Q4 switches off—$V_{ccD}$—down to $V_{cc} = 2V_{BE}$. One of the improvements of the present invention is that it provides the capacity to make $V_{ccU} > V_{ccD}$; that is, it can be made to exhibit a hysteresis. This permits the circuit of the present invention to be designed so as to retain control—and ensure disabled buffers—up to relatively high values of $V_{cc}$ during power-up without as a result exposing the extended circuit to the risk of being shut down when $V_{cc}$ momentarily dips due to noise during regular operation. This contrasts with the conventional power-up circuitry, for which the exchange of control between nOE and the power-up circuit occurs at the same value of $V_{cc}$ during power-up as it does during power-down. (Consequently, the conventional power-up circuitry must have a lower cut-out voltage in order to avoid unwanted cut-in during noise-induced dips in $V_{cc}$.) Another improvement of the present invention is the speed with which it cuts in and out when $V_{cc}$ reaches $V_{ccD}$ and $V_{ccU}$, respectively. This switching speed is effected by the positive feedback nature of the Q3 circuit, which in principle leads to instantaneous switching and in practice leads to nanosecond times.

The manner in which the preferred embodiment of the present invention operates can be understood with reference to FIG. 5. As $V_{cc}$ increases from zero during power-up, $V_{4C}$ increases monotonically until it reaches $2V_{BE}$, at which point the forward-biased base-emitter junctions of Q5 and Q9 begin to conduct, switching those two OEG transistors on. As $V_{cc}$ continues to increase, $V_{4C}$ is effectively clamped at $2V_{BE}$ by its series connection to ground through Q5 and Q9. (The rest of the drop from $V_{cc}$ to ground through that branch of the circuit occurs as an IR drop across R7.) Once $V_{4C}$ reaches its clamped level of $2V_{BE}$—and not before—the OEG transistors Q5 and Q9 are turned on. With those transistors conducting, the OEG's output to the buffer (OE) can be seen to be locked at the low voltage level—binary logic zero. This results in the buffer being disabled. As shown above, this threshold level is reached when the rising $V_{cc}$ reaches $2V_{BE}$, just as is the case with the conventional power-up circuit. As $V_{cc}$ rises beyond $2V_{BE}$, Q5 and Q9 initially remain locked on due to the output from the power-up circuit—$V_{OUT} = 2V_{BE}$—to the base of Q5. However, when the rising $V_{cc}$ causes the Q4 base voltage—$V_{4B}$—to rise to $V_{BE}$, Q4 turns on and $V_{4C} (= V_{OUT})$ immediately falls below $2V_{BE}$ and in so doing pulls the base of Q5, turning Q5 off. When this happens, control of the OEG passes to the main circuit, and in particular to the nOE input to the base of Q6 in the OEG. (Prior to that point, it did not matter whether Q6 was conducting or not; the fact that Q5 was conducting ensured that Q9 was conducting and that OE had the value needed to disable the buffer. Q9 is a "pulldown" transistor with respect to OE; the Q5, Q6 pair and associated circuitry constitutes a logic OR gate.)

The $V_{cc}$ value at which Q4 switches on during power-up is the cut-out voltage defined above: $V_{ccU}$. It can be easily expressed in terms of the circuit elements of the power-up circuit illustrated in FIG. 4 and FIG. 5. The requisite calculation also illustrates that Q4, once it is on, will not switch off again just because $V_{cc}$ falls below $V_{ccU}$.

To calculate $V_{ccU}$, note that $V_{cc}$ connects to the base of Q4 across R3 and the forward-biased base-emitter junction of diode-connected Q2. Consequently, when current $I_{R3}>0$ is passing through R3, the Q4 base voltage—$V_{4B}$—is $$V_{4B}=V_{cc}-I_{R3}R_3-V_{BE} \quad (4)$$

In order for Q4 to turn on, it is necessary for $V_{4B}$ to be equal to $V_{BE}$. Since, by definition, this turn-on occurs when $V_{cc}$ reaches $V_{ccU}$, this leads to the condition $$V_{BE}=V_{ccU}-I_{R3}R_3-V_{BE}. \quad (5)$$

$$V_{ccU}=2V_{BE}+I_{R3}R_3 \quad (6)$$

But (from the fact that Q3 is on and from assumptions regarding operation of the various transistors) we know that the current through R3 is equal to the sum of the currents through R5 and R6. (We are making the reasonable assumption that when these transistors are operating in the linear range their base currents are zero even when they are on. Equivalently, we are using the assumption that $\beta$, the ratio of the collector current to the base current, is infinite.) Using that and the fact that the voltage drop across R5 is always equal to the base voltage of Q4, which at turn-on of Q4 is $V_{BE}$, we see that $I_{R5}=V_{BE}/R_5$. Similarly, since the base voltage of Q3 is clamped at $2V_{BE}$ and the base-emitter drop at Q3 (immediately prior to and at the instant of Q4 turn-on) is $V_{BE}$ it is seen that the drop to ground across R6 is also $V_{BE}$ (so that $I_{R6}=V_{BE}/R_6$). Thus, $$I_{R3}=I_{R5}+I_{R6}=(V_{BE}/R_5)+(V_{BE}/R_6)=V_{BE}[(1/R_5)+(1/R_6)] \quad (7)$$

$$V_{ccU}=2V_{BE}+V_{BE}R_3[(1/R_5)+(1/R_6)]=V_{BE}[2+(R_3/R_5)+(R_3/R_6)] \quad (8)$$

The condition for Q4 turn-on has thus been stated entirely in terms of the resistances R3, R5, and R6, all of which can be selected.

Note that once $V_{cc}$ reaches the threshold at which Q4 turns on, the drop in the base voltage of Q5 is extremely rapid, largely because of the positive feedback role played by Q3. Once Q4 begins to turn on and $V_{OUT}$ drops below $2V_{BE}$ the base of Q3 is pulled, turning Q3 off. Since this eliminates that paper of the voltage drop across R3 corresponding to current through Q3, this cause a sudden boost in the base voltage of Q4, and thereby hastens the Q4 turn-on. Thus Q3 ensures that once Q4 begins to conduct at all, its rate of turn-on is no longer determined and limited by the $V_{cc}$ rate of rise. As a related consequence, the drop of $V_{OUT}$ (and hence of the Q5 base voltage), especially when compared with the changing $V_{cc}$. In terms of the edge rate of the rising $V_{cc}$, the feedback feature of the present circuit provides a gain which is extremely great, thus limiting the period of time during which control over the OEG is exercised by both the nOE and the power-up circuit.

All thing being equal, one would like to maintain the buffer disabled until $V_{cc}$ is as close to its operating level as possible. Heretofore, this desire had to be moderated by concern that subsequent fluctuations in $V_{cc}$ due to noise could lower $V_{cc}$ to the point where the power-up circuit again would inappropriately cut in, taking control away from the main circuitry and shutting down the circuit. As a consequence, the $V_{cc}$ level at which one designed the power-up circuit to relinquish control was something of a compromise. However, with the hysteresis of the circuit embodied in the present invention one can have the best of both worlds—the value of $V_{cc}$ at which the power-up circuit relinquishes control can be set high enough to ensure that transient behavior is past while still retaining a "cushion" with respect to noise-induced fluctuations of $V_{cc}$ so as not to prevent the output buffer from suddenly being disabled when its associated output gate was intended to be communicating with the common bus.

The calculation of the cut-in voltage $V_{ccD}$, that is, the voltage at which a decreasing $V_{cc}$ causes the power-up circuit to exert control, proceeds as follows. Referring to FIG. 4, and as noted above, once Q4 turns on Q3 becomes non-conducting, thus ensuring that the current through R3 all passes on through R5. Therefore, even though EQS (4) and (5) are completely general and hold both for $V_{cc}$ ramping up and $V_{cc}$ ramping down, $I_{R3}$ behaves differently during the ramping up than it does during the ramping down. More specifically, $I_{R3}$ has a different functional dependence on $V_{cc}$ once Q4 has turned on (and Q3 has turned off): $I_{R3}=V_{BE}/R_5$. Substituting this different functional dependence into EQ(6) leads to $$V_{ccD}=V_{BE}[2+(R_3/R_5)] \quad (9)$$

From a comparison of EQS (8) and (9), it can be verified that $V_{ccU}>V_{ccD}$. In particular, $$V_{ccU}-V_{ccD}=V_{BE}(R_3/R_6), \quad (10)$$

This means that, as $V_{cc}$ is rising, the threshold at which the power-up circuitry cuts out is greater by an increment $V_{BE}(R_3/R_6)$ than the threshold at which it cuts back in as $V_{cc}$ is falling. This is the hysteresis and it can be seen to be tied to the hysteresis in $I_{R3}$.

As a specific example, the resistance values of R3, R5, and R6 are selected to be identical to one another (they will typically have values on the order of 10K). From EQ(8) it can be seen that with this selection the power-up circuit will cut out at $V_{cc}=V_{ccU}=4V_{BE}$. If a high-level input to nOE is assumed, it can be seen with reference to FIG. 5 that Q6 will turn on at $V_{cc}$ slightly greater than $3V_{BE}$. This means that the power-up circuit will hold Q5 on—and hence the buffer disabled—for the range of $V_{cc}$ from $2V_{BE}$ up to $4V_{BE}$ whereas nOE will have the potential to hold the buffer disabled as $V_{cc}$ increases from $3V_{BE}$ up to its normal operating range. In other words, Q9 will turn on when $V_{cc}$ reaches $2V_{BE}$ and will continue to receive base drive from either Q5 or Q6 over the remaining $V_{cc}$ range. This provides an overlap of approximately $1V_{BE}$ from point where Q6 turns on until the point where Q5 turns off. In contrast, the conventional circuit, limited by concern with noise-induced fluctuations in $V_{cc}$ to a cut-out voltage no higher than $3.5V_{BE}$, provides an overlap under similar circumstances of only $0.5V_{BE}$, only one-half as much as is possible with the power-up circuit which is the subject of this invention.

Continuing with the above example, it can be seen from EQ(9) that during power-down the circuit will cut in at $V_{ccD}=3V_{BE}$. This is as low as the level allowed by the conventional power-up circuit. Yet with the circuit embodied in the present invention, a judicious choice of R3, R5, and R6 could yield an even lower cut-in level and hence even greater immunity from unwanted shutdowns due to noise-induced fluctuations in $V_{cc}$.

Figure 6:
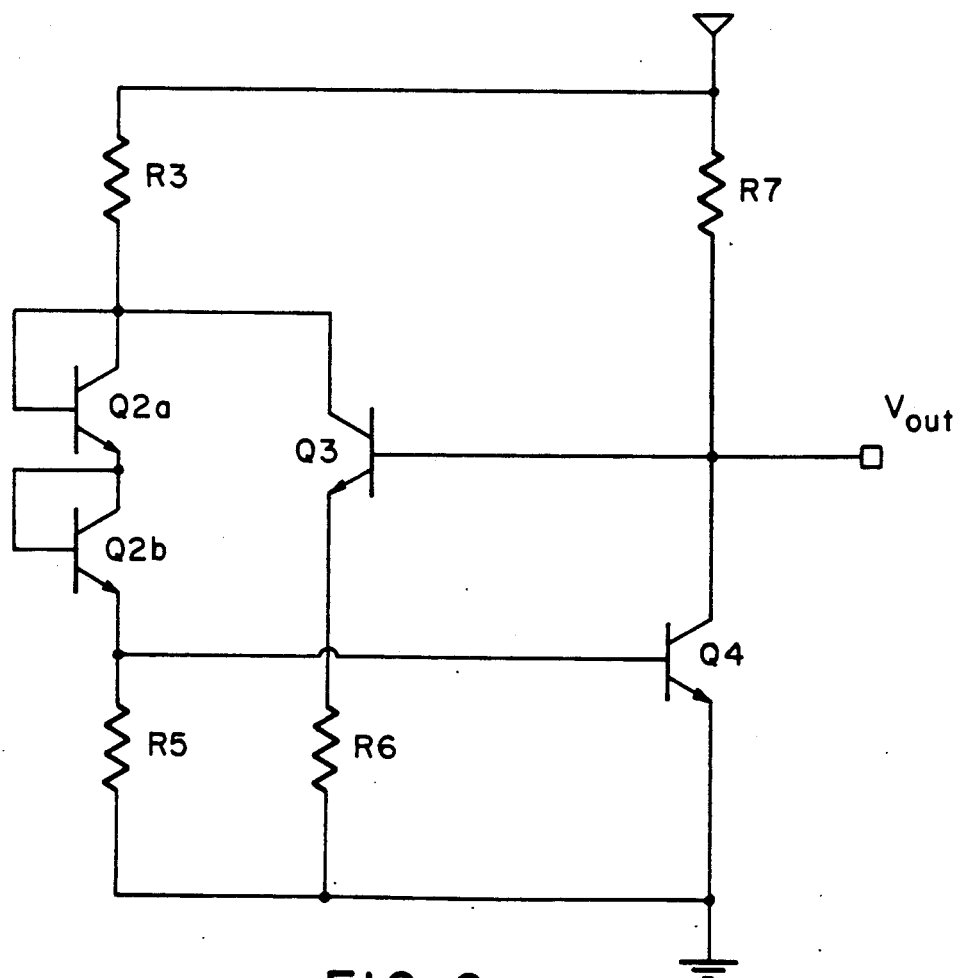
FIG. 6 is a circuit diagram showing a slight modification of the preferred embodiment of the present invention.

In addition to adjusting the resistance values in the preferred embodiment of the invention, one can go to a circuit related in form to that of the preferred embodiment, such as that shown in FIG. 6 in which the diode-connected transistor Q2 of FIG. 5 has been replaced by two diode-connected transistors in series: Q2a and Q2b. Using the same reasoning as set out above, one obtains for the cut-out and cut-in voltages, $V_{ccU}^{(2)}$ and $V_{ccD}^{(2)}$, the following expressions.

$$V_{ccU}^{(2)} = V_{BE}[3+(R_3/R_5)+(R_3/R_5)] \quad (11)$$

$$V_{ccD}^{(2)} = V_{BE}[3+(R_3/R_5)] \quad (12)$$

The hysteresis is seen to be the same as given by EQ.(10). If, in the circuit depicted in FIG. 6, $R_3=10K$, and $R_5=R_6=20K$, then $V_{ccU}^{(2)}=4V_{BE}$ and $V_{ccD}^{(2)}=3.5V_{BE}$.

For the generalized circuit with n diode-connected transistors in series, the hysteresis will remain $V_{BE}(R_3/R_6)$. The generalized cut-out and cut-in voltages $V_{ccU}^{(n)}$ and $V_{ccD}^{(n)}$ are then expressed as follows.

$$V_{ccU}^{(n)} = V_{BE}[(1+n)+(R_3/R_5)+(R_3/R_5)] \quad (13)$$

$$V_{ccD}^{(n)} = V_{BE}[(1+n)+(R_3/R_5)] \quad (14)$$

I claim:

1. A power-up circuit with hysteresis to be used in combination with an output enabling gate as one of a plurality of such combinations each exercising control over an individual output buffer in a multi-chip logic circuit so as to guard said logic circuit against transients during power-up and power-down of a common power supply voltage $V_{cc}$ used to energize said logic circuit, where said power-up circuit controls said output enabling gate during power-up so as to maintain said output buffer in a disabled state until said common power supply voltage $V_{cc}$ has attained a level $V_{ccU}$ and where said power-up circuit seizes control so as to disable said output buffers during said power-down once said common power supply voltage $V_{cc}$ has fallen to $V_{ccD}$, where $V_{ccU} > V_{ccD}$, thereby establishing said hysteresis, said power-up circuit comprising:

(a) a coupling means for energizing said power-up circuit by said common power supply voltage $V_{cc}$;
  (b) hysteretic transistor-resistor means, wherein said hysteretic transistor-resistor means comprises:
    (i) a threshold transistor, wherein a collector of said threshold transistor is coupled to said common power supply voltage $V_{cc}$ through a first resistor means, wherein an emitter of said threshold transistor is coupled directly to ground, wherein a base of said threshold transistor is coupled to ground through a second resistor means, and wherein a plurality of series-connected diode-connected transistors coupled in series with a third resistor means couples said base of said threshold transistor to said common power supply voltage $V_{cc}$; and
    (ii) a feedback transistor, wherein said collector of said threshold transistor is coupled directly to a base of said feedback transistor, wherein a collector of said feedback transistor is coupled to said common power supply voltage $V_{cc}$ through a third resistor means, and wherein an emitter of said feedback transistor is coupled to ground through a fourth resistor means; and
  (c) an output coupling means operatively coupled to said hysteretic transistor-resistor means for applying to said output enabling gate an output voltage signal $V_{OUT}$ generated by said power-up circuit; wherein said hysteretic transistor-resistor means is constructed and arranged so that:
    (i) said output voltage signal $V_{OUT}$ is at a binary logic one level throughout a determinable range of said common power supply voltage $V_{cc}$ during said power-up;
    (ii) at a certain power-up threshold level $V_{ccU}$ of said common power supply voltage $V_{cc}$ said output voltage signal $V_{OUT}$ abruptly changes to a binary logic zero level;
    (iii) at a certain power-down threshold value $V_{ccD}$ of said common power supply voltage $V_{cc}$ said output voltage signal $V_{OUT}$ abruptly changes from a binary logic zero level to a binary logic one level;
    (iv) said power-up threshold value $V_{ccU}$ is greater than said power-down threshold value $V_{ccD}$ by an increment depending on said resistor means of said power-up circuit and;
    (v) said output voltage signal $V_{OUT}$ of said power-up circuit switches between binary logic zero level and binary logic one level at a rate which is extremely fast and is independent of the rate with which said common power supply voltage $V_{cc}$ is changing during said power-up and said power-down.

2. The power-up circuit with hysteresis of claim 1 wherein said output coupling means comprises:
  (a) the direct connection of said output voltage signal $V_{OUT}$ of said power-up circuit to a base of an input transistor of said output enable gate;
  (b) the direct connection of an emitter of said input transistor of said output enable gate to a base of a pulldown transistor; and
  the direct connection of a collector of said pulldown transistor to an OE terminal of said output enable gate, such that when said output voltage signal $V_{OUT}$ is at binary logic one level said OE terminal is at binary logic zero level.

3. The power-up circuit of claim 2 wherein said plurality of series-connected diode-connected transistors is replaced with a single diode-connected transistor.

4. The power-up circuit of claim 2 wherein said plurality of series-connected diode-connected transistors comprises two series-connected diode-connected transistors.

5. The power-up circuit of claim 2 wherein said plurality of series-connected diode-connected transistors is replaced with a plurality of diode means.

6. The power-up circuit of claim 3 wherein each of said resistor means has the resistance 10K.

7. An improved tristate enable gate to be used in combination with an associated common bus tristate output buffer device, said tristate enable gate having:
 (a) means for receiving and applying a tristate signal input (nOE),
 (b) an enable gate phase splitter transistor means comprising a logic OR gate having a first input and a second input, where said first input of said logic OR gate is operatively coupled to receive logic one and zero tristate enable signals,
 (c) a pulldown transistor means operatively coupled to said enable gate phase splitter transistor means, said pulldown transistor means conducting when a logic one signal is applied by said enable gate phase splitter transistor means to a base of said pulldown transistor means, and
 (d) an enable gate signal output (OE) for maintaining said common bus tristate output buffer device in the high impedance third state when said pulldown transistor means is conducting, said tristate enable gate and said tristate output buffer device having a common power supply $V_{cc}$, wherein the improvement is a hysteretic power-up circuit operatively coupled to said second input of said logic OR gate and to said common power supply $V_{cc}$, wherein said hysteretic power-up circuit comprises:
 (a) a threshold transistor Q4 comprising a threshold transistor base, a threshold transistor collector and a threshold transistor emitter;
 (b) a collector resistor R7;
 (c) a base resistor R3;
 (d) a base-ground resistor R5;
 (e) an emitter-ground resistor R6;
 (f) a plurality of series-connected diode-connected transistors; and
 (g) a positive feedback transistor Q3 comprising a feedback transistor base, a feedback transistor collector and a feedback transistor emitter, wherein said threshold transistor collector is coupled to said common power supply $V_{cc}$ through said collector resistor R7, said threshold transistor base is coupled to said common power supply $V_{cc}$ through said base resistor R3 in series with said plurality of series-connected diode-connected transistors, said threshold transistor base further coupled to ground through said base-ground resistor R5, said threshold transistor emitter being coupled directly to ground, and wherein said feedback transistor base is coupled directly to said threshold transistor collector, said feedback transistor collector is coupled directly to said common power supply $V_{cc}$ through said base resistor R3 and said feedback transistor emitter is coupled to ground through said emitter-ground resistor R6, wherein said hysteretic power-up circuit delivers a logic one signal to said second input of said logic OR gate during a power-up transient of said common power supply $V_{cc}$ when and only when the level of said common power supply $V_{cc}$ is in the range from a first voltage level 2 $V_{BE}$ to a higher voltage level $V_{ccU}$, wherein said hysteretic power-up circuit delivers a logic one signal to said second input of said logic OR gate during a power-down transient of said common power supply $V_{cc}$ when and only when the level of said common power supply $V_{cc}$ is in the range from a first voltage level $V_{ccD}$ to a lower voltage level 2 $V_{BE}$, where $V_{ccD} \leq V_{ccU}$ and where $V_{BE}$ is the voltage drop across a base-emitter junction of said pulldown transistor means when said pulldown transistor means is conducting, wherein said positive feedback transistor drives at an extremely fast rate the transition of said power-up circuit from a logic one signal to a logic zero signal during power-up and the transition of said power-up circuit from a logic zero signal to a logic one signal during power-down, wherein said extremely fast rate of transition is independent of the rate at which said common power supply $V_{cc}$ powers up or powers down, and wherein said tristate enable gate maintains the high impedance state of said common bus tristate output buffer during power-up as said common power supply $V_{cc}$ increases from 2 $V_{BE}$ up to $V_{ccU}$ and during power-down as said common power supply $V_{cc}$ decreases from $V_{ccD}$ to 2 $V_{BE}$, regardless of the logic one or zero of said tristate enable signal input (nOE).

8. The enable gate of claim 7, wherein said diode-connected transistor means comprises a single diode-connected transistor and $$V_{ccU} = V_{BE}[2+(R3/R5)+(R3/R6)]$$

$$V_{ccD} = V_{BE}[2+(R3/R5)].$$

9. The improved tristate enable gate of claim 7 wherein said plurality of diode-connected transistors in series is replaced with a plurality of diode means.

10. The improved tristate enable gate of claim 7 wherein said plurality of diode-connected transistors in series is replaced with a single diode-connected transistor.

11. The improved tristate enable gate of claim 7 wherein each of said resistors has the resistance 10K.

* * * * *